United States Patent
Zhuang et al.

(10) Patent No.: US 9,748,367 B2
(45) Date of Patent: Aug. 29, 2017

(54) METHOD FOR MAKING THIM FILM TRANSISTOR

(71) Applicants: Tsinghua University, Beijing (CN); HON HAI PRECISION INDUSTRY CO., LTD., New Taipei (TW)

(72) Inventors: Da-Ming Zhuang, Beijing (CN); Ming Zhao, Beijing (CN); Ming-Jie Cao, Beijing (CN); Li Guo, Beijing (CN); Ze-Dong Gao, Beijing (CN); Yao-Wei Wei, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 15/340,252

(22) Filed: Nov. 1, 2016

(65) Prior Publication Data
US 2017/0047436 A1    Feb. 16, 2017

Related U.S. Application Data

(62) Division of application No. 14/749,345, filed on Jun. 24, 2015, now Pat. No. 9,570,627.

(30) Foreign Application Priority Data

May 4, 2015  (CN) .......................... 2015 1 0219860

(51) Int. Cl.
*H01L 29/66* (2006.01)
*H01L 29/24* (2006.01)
*H01L 29/786* (2006.01)
*H01L 21/02* (2006.01)
*H01L 29/417* (2006.01)
*H01L 29/423* (2006.01)
*H01L 27/12* (2006.01)

(52) U.S. Cl.
CPC .. *H01L 29/66969* (2013.01); *H01L 21/02565* (2013.01); *H01L 21/02631* (2013.01); *H01L 27/124* (2013.01); *H01L 27/1225* (2013.01); *H01L 29/24* (2013.01); *H01L 29/41733* (2013.01); *H01L 29/42384* (2013.01); *H01L 29/66742* (2013.01); *H01L 29/7869* (2013.01); *H01L 29/78693* (2013.01)

(58) Field of Classification Search
None
See application file for complete search history.

(56) References Cited

U.S. PATENT DOCUMENTS

| | | | | |
|---|---|---|---|---|
| 2014/0042437 A1* | 2/2014 | Yamazaki | ......... | H01L 29/78693 257/43 |
| 2015/0079728 A1* | 3/2015 | Yamazaki | ............. | H01L 21/441 438/104 |
| 2015/0198850 A1* | 7/2015 | Tasaka | .................. | G02F 1/1368 349/46 |

* cited by examiner

*Primary Examiner* — Whitney T Moore
(74) *Attorney, Agent, or Firm* — Steven Reiss

(57) ABSTRACT

A method for making a thin film transistor includes a step of forming a semiconducting layer, a source electrode, a drain electrode, a gate electrode, and an insulating layer on an insulating substrate. A process of forming the semiconducting layer comprises a step of sputtering an oxide semiconductor film on a substrate by using a sputtering target comprising $In_2Ce_xZnO_{4+2x}$, wherein $x=0.5\sim2$.

14 Claims, 15 Drawing Sheets

METHOD FOR MAKING THIM FILM TRANSISTOR

CROSS-REFERENCE TO RELATED APPLICATIONS

This application is a division application of U.S. patent application Ser. No. 14/749,345, filed on Jun. 24, 2015, entitled "THIN FILM TRANSISTOR AND METHOD FOR MAKING THE SAME, THIM FILM TRANSISTOR PANEL AND DISPLAY DEVICE", which claims all benefits accruing under 35 U.S.C. §119 from China Patent Application No. 201510219860.9, filed on May 4, 2015, in the China Intellectual Property Office. This application is related to commonly-assigned applications entitled, "SPUTTERING TARGET AND METHOD FOR MAKING THE SAME", filed Jun. 24, 2015 Ser. No. 14/749,335; "OXIDE SEMICONDUCTOR FILM AND METHOD FOR MAKING THE SAME", filed Jun. 24, 2015 Ser. No. 14/749,340.

FIELD

The present disclosure relates to a method for making thin film transistor.

BACKGROUND

Display devices should have high resolution, high response speed, low energy consumption, high transparency, and flexibility. These qualities depend on performances of thin film transistors (TFTs) used in the display devices. An amorphous silicon TFT has a relatively low carrier mobility, which cannot meet the requirements of high resolution and large area display. A low temperature poly-silicon (p-Si) TFT can have a high mobility. However, a high cost is incurred in creating a large area display device with the p-Si TFT. Recently, an amorphous oxide semiconductor, indium gallium zinc oxide ($InGaZnO_4$, or IGZO), has been proposed. An IGZO based TFT has a high transparency, a low manufacturing temperature, and a good compatibility with the TFT manufacturing technology.

The mobility of the IGZO TFT is between that of the amorphous silicon TFT and the p-Si TFT, thus improvement is still required. An indium zinc oxide (IZO) device, with high carrier density and a low stability, is not a semiconductor but has a higher carrier mobility than that of IGZO.

BRIEF DESCRIPTION OF THE DRAWINGS

Implementations of the present technology will now be described, by way of example only, with reference to the attached figures.

DETAILED DESCRIPTION

Figure 1:
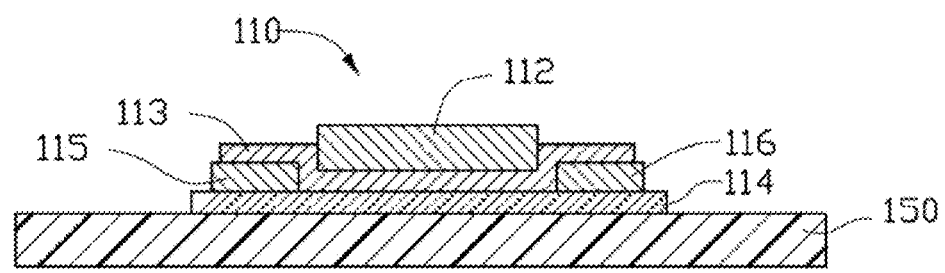
FIG. 1 is a schematic view of one embodiment of a thin film transistor.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "comprise" or "comprising" when utilized, means "include or including, but not necessarily limited to"; it specifically indicates open-ended inclusion or membership in the so-described combination, group, series, and the like. The term "contact" when utilized, means "direct contact" or "physical contact."

Referring to FIG. 1, one embodiment of a thin film transistor 110 is arranged on an insulating substrate 150. The thin film transistor 110 includes a semiconducting layer 114, a source electrode 115, a drain electrode 116, an insulating layer 113, and a gate electrode 112. The semiconducting layer 114 is disposed on the insulating substrate 150. The source electrode 115 and the drain electrode 116 are spaced with each other and electrically connected to the semiconducting layer 114. The gate electrode 112 is insulated from the semiconducting layer 114, the source electrode 115, and the drain electrode 116 by the insulating layer 113. A channel is defined in the semiconducting layer 114 at a region between the source electrode 115 and the drain electrode 116.

The semiconducting layer 114 is an oxide semiconductor film including In, Ce, Zn and O elements, having a molar ratio of In, Ce, and Zn as In:Ce:Zn is substantially 2:(0.5 to 2):1. The oxide semiconductor film is an n-type semiconductor having a carrier density of about $10^{12}$ $cm^{-3}$ to about $10^{20}$ $cm^{-3}$, and a carrier mobility of about 5.0 $cm^2V^{-1}s^{-1}$ to about 45.0 $cm^2V^{-1}s^{-1}$.

The oxide semiconductor film can be an amorphous solid. In another embodiment, the oxide semiconductor film can also comprise crystalline solid $In_2Ce_xZnO_{4+2x}$.

In one embodiment, unwanted and trace impurities are the only substance in the oxide semiconductor film beyond the elements of In, Ce, Zn and O. The smaller the amount of impurities in the sputtering target the better. In one embodiment, the amount of impurities in the oxide semiconductor film can be less than 10 ppm.

The oxide semiconductor film can have a band gap of about 3.0 eV to about 3.5 eV.

The oxide semiconductor film can have a visible light transmittance of about 60% to about 90%.

The oxide semiconductor film can have a thickness of about 50 nm to about 1000 nm.

The oxide semiconductor film can have a carrier density of about $10^{13}$ $cm^{-3}$ to about $10^{15}$ $cm^{-3}$.

The oxide semiconductor film can have a carrier mobility of about 12.3 $cm^2V^{-1}$ $s^{-1}$ to about 45.0 $cm^2V^{-1}$ $s^{-1}$.

The oxide semiconductor film can be obtained by a sputtering method using the sputtering target as described above.

One embodiment of the sputtering target comprises an indium cerium zinc oxide represented by formula $In_2Ce_xZnO_{4+2x}$, wherein x=0.5~2.

The sputtering target can be obtained by sintering a mixture of indium oxide ($In_2O_3$), cerium oxide ($CeO_2$), and zinc oxide (ZnO). In one embodiment, the sputtering target is obtained by sintering only the mixture of $In_2O_3$, $CeO_2$, and ZnO. Impurities may exist in the mixture. Besides $In_2O_3$, $CeO_2$, and ZnO, the mixture may only comprise the impurities. The smaller the amount of the impurities in the mixture the better. In one embodiment, the amount of the impurities can be less than 10 ppm.

The $In_2Ce_xZnO_{4+2x}$ is a crystal (or crystalline solid). The sputtering target can also comprise a non crystalline (amorphous) solid. The amorphous solid comprises indium oxide, cerium oxide, and zinc oxide. In one embodiment, a weight percentage of the crystalline $In_2Ce_xZnO_{4+2x}$ in the sputtering target is above 80%.

In one embodiment, the sputtering target only comprises $In_2Ce_xZnO_{4+2x}$, $In_2O_3$, $CeO_2$, and ZnO. In another embodiment, the sputtering target only comprises $In_2Ce_xZnO_{4+2x}$. Besides $In_2Ce_xZnO_{4+2x}$ (and $In_2O_3$, $CeO_2$, and ZnO if have), the sputtering target may only comprise unwanted and trace amounts of impurities. The smaller the amount of impurities in the sputtering target the better. In one embodiment, the amount of impurities in the sputtering target can be less than 10 ppm.

A relative density of the sputtering target can be larger than or equal to 90%. The relative density is a ratio of a real density of the sputtering target to a theoretical density of $In_2Ce_xZnO_{4+2}$.

A bulk resistance of the sputtering target can be in a range from about $10^{-2}$ Ωcm to about 10 Ωcm.

An average surface roughness of the sputtering target can be less than or equal to 2 microns, and in one embodiment be less than or equal to 0.5 microns.

An average flexural strength of the sputtering target can be larger than or equal to 50 MPa, and in one embodiment be larger than or equal to 55 MPa.

The thin film transistor 110 can have a top gate structure. The insulating layer 113 is disposed between the semiconducting layer 114 and the gate electrode 112. The insulating layer 113 is disposed on the semiconducting layer 114. Alternatively, the insulating layer 113 covers the semiconducting layer 114, the source electrode 115, and the drain electrode 116. The gate electrode 112 is disposed on the insulating layer 113. The gate electrode 112 is disposed above the semiconducting layer 114 and insulated from the semiconducting layer 114, the source electrode 115, and the drain electrode 116 by the insulating layer 113.

The source electrode 115 and the drain electrode 116 can be disposed on the semiconducting layer 114 or on the insulating substrate 150. More specifically, the source electrode 115 and the drain electrode 116 can be disposed on a top surface of the semiconducting layer 114, and at a same side of the semiconducting layer 114 as the gate electrode 112. In other embodiments, the source electrode 115 and the drain electrode 116 can be disposed on the insulating substrate 150 and covered by the semiconducting layer 114. In other embodiments, the source electrode 115 and the drain electrode 116 can be formed on the insulating substrate 150, and formed coplanar with the semiconducting layer 114.

Figure 2:
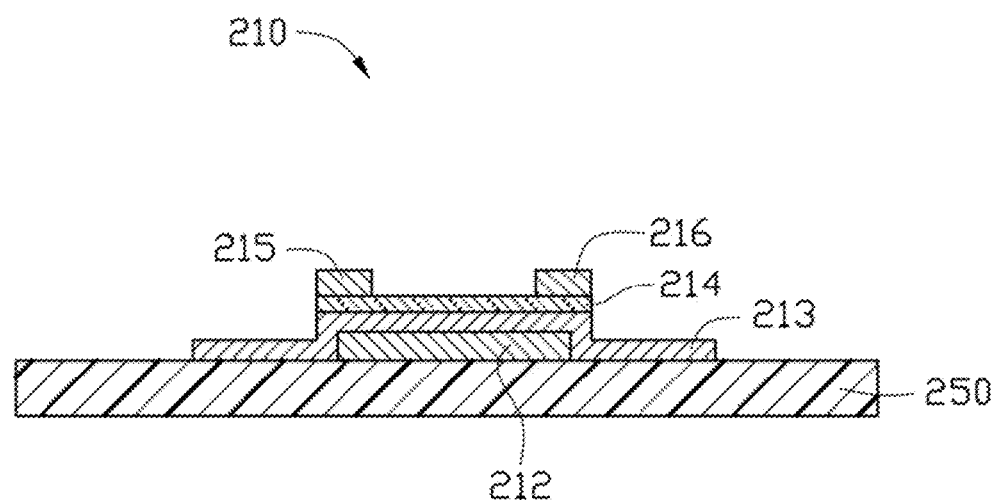
FIG. 2 is a schematic view of another embodiment of the thin film transistor.

Referring to FIG. 2, in another embodiment, the thin film transistor 210 has a bottom gate structure. The thin film transistor 210 includes a gate electrode 212, an insulating layer 213, a semiconducting layer 214, a source electrode 215, and a drain electrode 216. The thin film transistor 210 is disposed on an insulating substrate 250. The gate electrode 212 is disposed on the insulating substrate 250. The insulating layer 213 covers the gate electrode 212. The semiconducting layer 214 is disposed on the insulating layer 213, and insulated from the gate electrode 212 by the insulating layer 213. The source electrode 215 and the drain electrode 216 are spaced apart from each other and electrically connected to the semiconducting layer 214. The source electrode 215, and the drain electrode 216 are insulated from the gate electrode 212 by the insulating layer 213. A channel is defined in the semiconducting layer 214 at a region between the source electrode 215 and the drain electrode 216.

The source electrode 215 and the drain electrode 216 can be disposed on the semiconducting layer 214 or on the insulating layer 213. More specifically, the source electrode 215 and the drain electrode 216 can be disposed on a top surface of the semiconducting layer 214, and at a same side of the semiconducting layer 214 having the gate electrode 212. In other embodiments, the source electrode 215 and the drain electrode 216 can be disposed on the insulating layer 213 and covered by the semiconducting layer 214. In other embodiments, the source electrode 215 and the drain electrode 216 can be formed on the insulating layer 213, and coplanar with the semiconducting layer 214.

Figure 3:
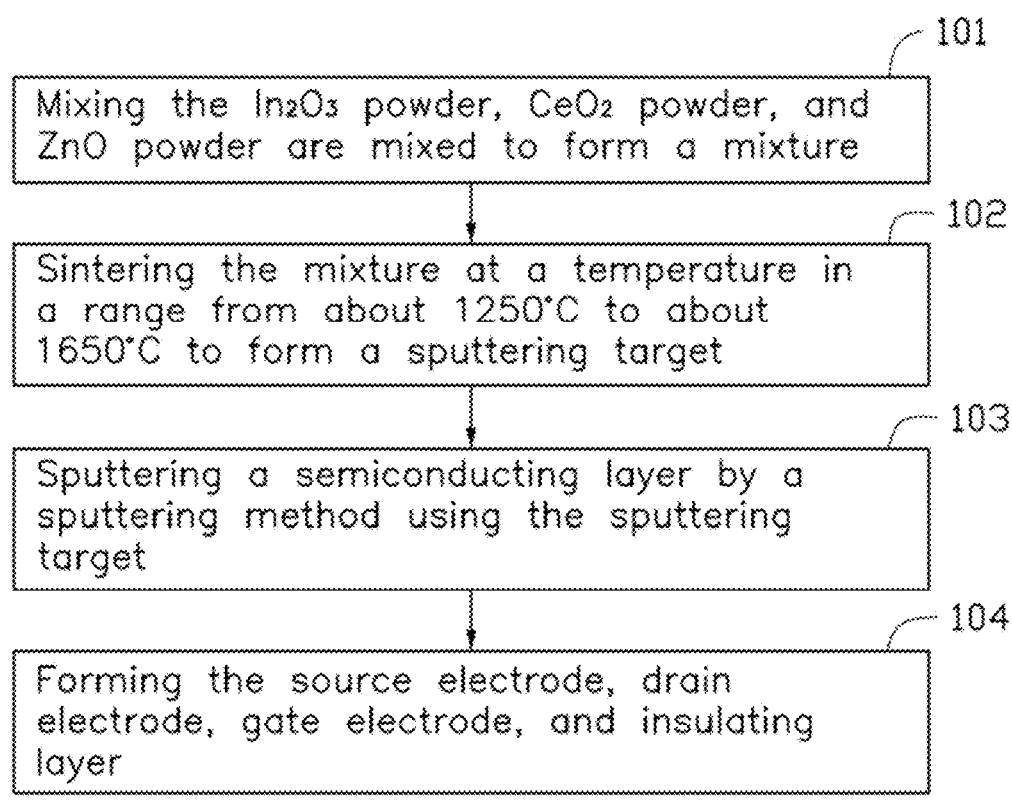
FIG. 3 is a flowchart of one embodiment of a method for making the thin film transistor.

Referring to FIG. 3, a flowchart in accordance with an illustrated example embodiment of a method for making the thin film transistor is presented. Each block shown in FIG. 3 represents one or more processes, methods, or subroutines carried out in the exemplary method. Additionally, the illustrated order of blocks is by example only and the order of the blocks can be changed. Depending on the embodiment, additional steps can be added, others removed, and the ordering of the steps can be changed. The embodiment of the method for making the thin film transistor comprises steps of forming the semiconducting layer, source electrode, drain electrode, gate electrode, and insulating layer on the insulating substrate. The step of forming the semiconducting layer comprises a step of sputtering an oxide semiconducting film on a substrate by a sputtering method using the sputtering target as described above.

At block 101, the $In_2O_3$ powder, $CeO_2$ powder, and ZnO powder are mixed to form a mixture. In the mixture, a molar ratio of indium (In), cerium (Ce), and zinc (Zn) as In:Ce:Zn is 2:(0.5 to 2):1.

At block 102, the mixture is sintered at a temperature in a range from about 1250° C. to about 1650° C. to form the sputtering target.

At block 103, the semiconducting layer is sputtered by a sputtering method using the sputtering target.

At block 104, the source electrode, drain electrode, gate electrode, and insulating layer are formed.

In the mixture, the particles of $In_2O_3$ powder, $CeO_2$ powder, and ZnO powder can respectively have an average diameter that is less than or equal to 10 microns. In one embodiment, the average diameter of the particles of $In_2O_3$ powder, $CeO_2$ powder, and ZnO powder can respectively be in a range from about 0.5 microns to about 2 microns.

The purity of the $In_2O_3$ powder, $CeO_2$ powder, and ZnO powder can be 3N (99.9 mass %) to 5N (99.999%).

A molar ratio of the $In_2O_3$ powder, $CeO_2$ powder, and ZnO powder as $In_2O_3:CeO_2:ZnO$ is 2:(1 to 4):2.

The $In_2O_3$ powder, $CeO_2$ powder, and ZnO powder can be mixed in air or in a protective atmosphere (e.g., in argon (Ar) or nitrogen ($N_2$) gas). The mixing of the $In_2O_3$ powder, $CeO_2$ powder, and ZnO powder can further comprise steps of: ball milling the $In_2O_3$ powder, $CeO_2$ powder, and ZnO powder together in a liquid medium to form a mixed substance; drying the mixed substance to remove the liquid medium to obtain the mixture that is dry. The liquid medium is not reactive with the $In_2O_3$ powder, $CeO_2$ powder, and ZnO powder and can be removed from the wet mixed substance by a drying step, and brings no impurity substance into the mixture. The liquid medium can be water, ethanol, acetone, or combinations thereof. The ball milling can take place in a ball milling machine. The liquid medium, $In_2O_3$ powder, $CeO_2$ powder, and ZnO powder are introduced into the ball milling machine. A rotating speed of the ball milling machine can be about 100 rpm to about 600 rpm. During the ball milling, the $In_2O_3$ powder, $CeO_2$ powder, and ZnO powder mix uniformly, the particle diameters of the powders can decrease, and the specific surface area of the particles of the powders can increase. The ball milling can last until the $In_2O_3$ powder, $CeO_2$ powder, and ZnO powder are uniformly mixed and the particle diameters of the powders have decreased to the desired sizes. The mixed substance is taken out from the ball milling machine and dried, for example at about 30° C. to about 60° C., to remove the liquid medium. The mixed substance can be dried in air or a protective atmosphere (e.g., Ar gas or $N_2$ gas). In one embodiment, the mixed substance is dried at a high purity (3N to 5N) of protective gas.

The mixture can be sintered in a protective atmosphere (e.g., in argon (Ar) or nitrogen ($N_2$) gas).

The mixture can be molded or pressed into a desired shape before or during the sintering step. During the sintering step, the $In_2O_3$ powder, $CeO_2$ powder, and ZnO powder react to form the crystalline solid $In_2Ce_xZnO_{4+2x}$.

A hot pressing method or a hot isostatic pressing (HIP) method can be used to simultaneously mold/press and sinter the mixture. The hot pressing applies a pressure of about 30 MPa to 100 MPa at the temperature of about 1250° C. to about 1650° C. for about 1 hour to about 24 hours. The hot isostatic pressing applies a pressure of about 100 MPa to 300 MPa at the temperature of about 1250° C. to about 1650° C. for about 1 hour to about 40 hours.

When the sintering step takes place after the molding/pressing step, the molding/pressing step can be processed by using a cold pressing method or a cold isostatic pressing method. The mixture can be filled into a mold and molded/pressed by applying a pressure of about 30 MPa to about 300 MPa to form the desired shape. The mixture with the desired shape can be sintered under normal pressure.

The sputtering target can be obtained directly from the sintering step. In another embodiment, the product of the sintering step can be shaped or polished to form the sputtering target.

The sputtering method can be a DC (direct current) sputter method, an AC (alternating current) sputter method, an RF (radio frequency) sputter method, a magnetron sputter method, or a medium frequency magnetron sputter method. The current of the sputtering can be about 0.1 A to about 2.0 A. The sputtering can take place for about 1 minute to about 120 minutes.

The sputtering can be at room temperature or a high temperature (e.g., smaller than or equal to 400° C.). When the high temperature is used in the sputtering, the method for making the thin film transistor further comprises a step of preheating the substrate. The substrate can be previously heated in vacuum at a temperature of about 50° C. to about 400° C.

A carrier gas is introduced into the sputtering chamber during the sputtering. The carrier gas can be a noble gas, a mixture of a noble gas and oxygen gas, or a mixture of a noble gas and hydrogen gas. In one embodiment, the noble gas can be Ar gas. For example, the carrier gas can be a mixture of Ar gas and oxygen gas. A flow rate of the oxygen gas can be less than 3 sccm. A purity of the carrier gas can be 3N to 5N.

The pressure in the sputtering chamber during the sputtering can be about 0.1 Pa to about 2.0 Pa.

The substrate can be an insulating substrate capable of enduring the sputtering temperature. Glass, silicon, or polymer (PET, PI, PE, etc.) can be used as the substrate. When the sputtering is at a relatively low temperature (e.g., at room temperature), the choice of the substrate material is wide.

Before the sputtering, the substrate can be previously cleaned to remove impurities on the surface of the substrate.

Before the sputtering, the sputtering target can be fixed on a support. An outer surface of the sputtering target can be parallel to the surface of the substrate. In another embodiment, an angle can be formed between the outer surface of the sputtering target and the surface of the substrate, the angle can be 20° to 85°. A distance between the outer surface of the sputtering target and the surface of the substrate can be smaller than or equal to 8 cm.

The oxide film formed on the surface of the substrate can be directly used as the oxide semiconductor film. In another embodiment, the method can also comprise the annealing step. The oxide film can be annealed in a vacuum, or in an $N_2$ or noble gas (e.g., Ar gas) atmosphere. The background vacuum used in the annealing can be about $10^{-3}$ Pa to about 10 Pa. The annealing temperature can be in a range from about 100° C. to about 400° C. A speed of temperature increase can be in a range from about 1° C./min to about 20° C./min to increase the temperature of the oxide film to the annealing temperature. The oxide film can be annealed for about 1 hour to about 10 hours. The annealing step can slightly increase the crystallization of the oxide film to adjust the performance of the oxide semiconductor film.

The sputtering target is formed by doping an indium zinc oxide doped with Ce to obtain $In_2Ce_xZnO_{4+2x}$, wherein x=0.5~2. By using the sputtering target, the n-type oxide semiconductor film can be obtained, wherein the molar ratio of In, Ce, and Zn as In:Ce:Zn is 2:(0.5 to 2):1. The carrier density of the n-type oxide semiconductor film can be about $10^{12}$ cm$^{-3}$ to about $10^{20}$ cm$^{-3}$, and the carrier mobility of the n-type oxide semiconductor film can be about 5.0 cm$^2$V$^{-1}$ s$^{-1}$ to about 45.0 cm$^2$V$^{-1}$ s$^{-1}$. The n-type oxide semiconductor film can be used in an n-type TFT. The amount of Ce in the oxide semiconductor film cannot be too large or too small. When x<0.5, the oxide semiconductor film has properties similar to those of IZO, which has a relatively low stability, and thus not proper as a TFT semiconductor. When x>2, the oxide semiconductor film has a relatively low carrier mobility that is not suitable for high resolution display devices.

Figure 4:
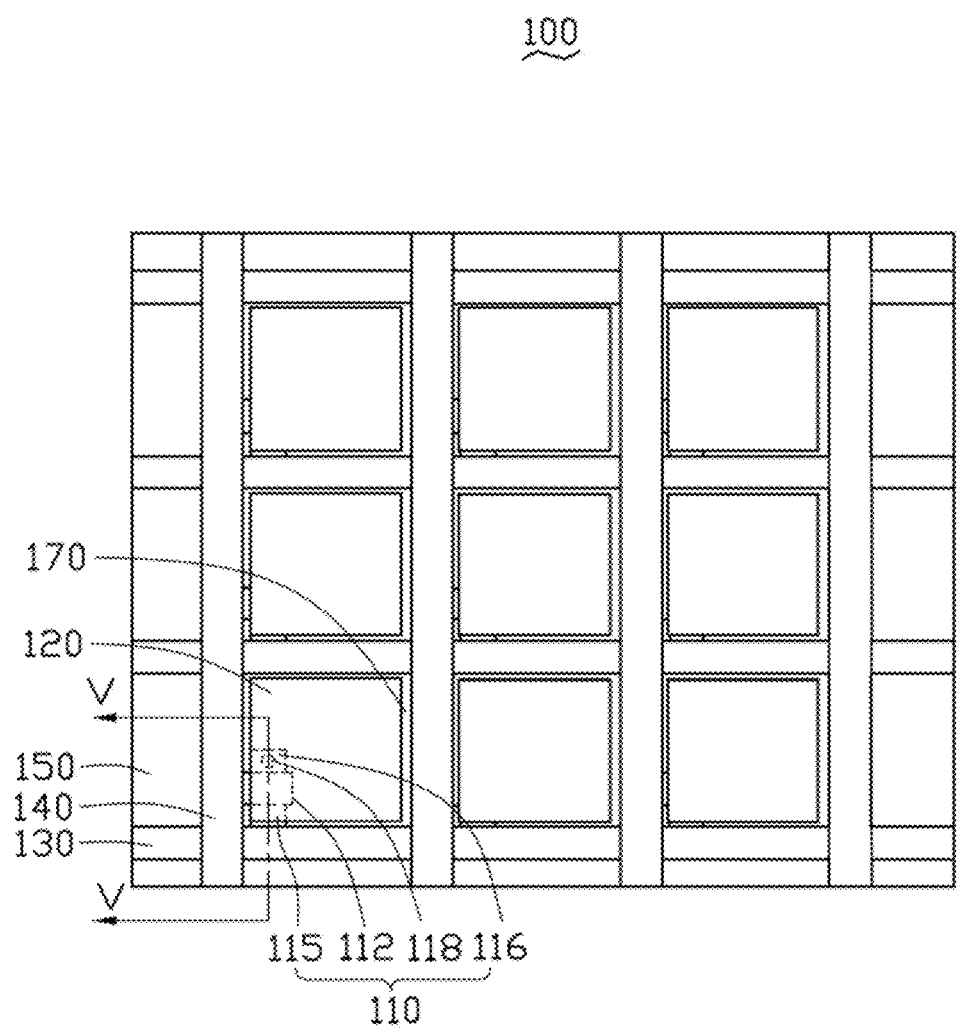
FIG. 4 is a schematic top view of one embodiment of a thin film transistor panel.
Figure 5:
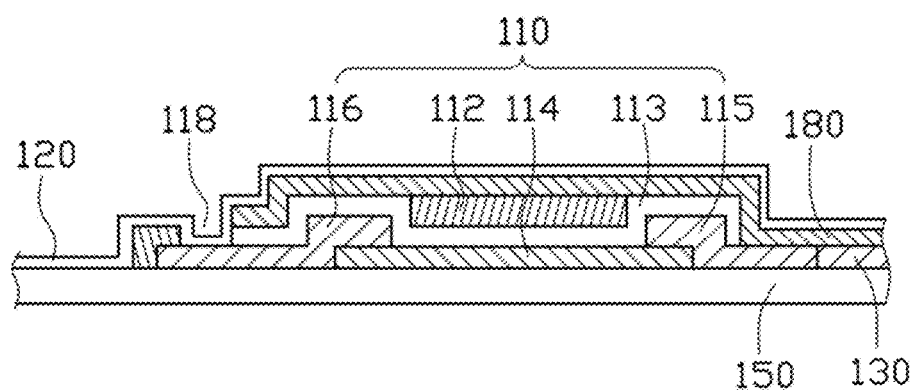
FIG. 5 is a schematic side view of one embodiment of a thin film transistor panel.

Referring to FIG. 4 and FIG. 5, one embodiment of a thin film transistor panel 100 includes a plurality of thin film transistors 110, a plurality of pixel electrodes 120, a plurality of source lines 130 (i.e., data lines), a plurality of gate lines 140, and an insulating substrate 150.

The thin film transistors 110, pixel electrode 120, source lines 130, and gate lines 140 are all coplanar and disposed on a same surface of the insulating substrate 150. The source lines 130 are spaced with each other and arranged parallel along an X direction. The gate lines 140 are spaced with each other and arranged parallel along a Y direction. The X direction is perpendicular to the Y direction. Thus, the surface of the insulating substrate 150 is divided into a matrix of grid regions 170. The pixel electrodes 120 and the thin film transistors 110 are separately disposed in the grid regions 170. The pixel electrodes 120 are spaced with each other. The thin film transistors 110 are spaced from each other. Each grid region 170 contains one thin film transistor 110 and one pixel electrode 120 stacked or spaced apart from each other. In the present embodiment, in each grid region 170, the pixel electrode 120 covers the thin film transistor 110.

The pixel electrode 120 is electrically connected with the drain electrode 116 of the thin film transistor 110. More specifically, a passivation layer 160 can be further disposed on the thin film transistor 110. The passivation layer 160 covers the thin film transistor 110 and defines a through hole 118 to expose the drain electrode 116 of the thin film transistor 110. The pixel electrode 120 covers the entire grid region 170 and the thin film transistor 110 therein, and electrically connects to the drain electrode 116 at the through hole 118. Other part of the thin film transistor 110 except the drain electrode 116 is insulated from the pixel electrode 120 by the passivation layer 160. The material of the passivation layer 160 can be a rigid material such as silicon nitride (Si$_3$N$_4$) or silicon dioxide (SiO$_2$), or a flexible material such as polyethylene terephthalate (PET), benzocyclobutenes (BCB), or acrylic resins.

Each source electrode 115 of the thin film transistor 110 is electrically connected with one source line 130. More specifically, the source electrodes 115 of each line along the X direction of the thin film transistors 110 are electrically connected with one source line 130 near the thin film transistors 110.

Each gate electrode 112 of the thin film transistor 110 is electrically connected with one gate line 140. More specifically, the gate electrodes 112 of each line along the Y direction of the thin film transistors 110 are electrically connected with one gate line 140 near the thin film transistors 110.

The pixel electrodes 120 are conductive films made of a conductive material. When the pixel electrodes 120 is used in the liquid crystal displays, the materials of the pixel electrodes 120 can be selected from the group consisting of indium tin oxide (ITO), antimony tin oxide (ATO), indium zinc oxide (IZO), conductive polymer, and metallic carbon nanotubes.

The materials of the source lines 130 and the gate lines 140 are conductive, and can be selected from the group consisting of metal, alloy, silver paste, conductive polymer, or metallic carbon nanotube wires. The metal or alloy can be selected from the group consisting of aluminum (Al), copper (Cu), tungsten (W), molybdenum (Mo), gold (Au), titanium (Ti), neodymium (Nd), palladium (Pd), cesium (Cs), and combinations thereof. A width of the source lines 130 and the gate lines 140 can be in the range from about 0.5 nanometers to about 100 micrometers. In the present embodiment, the material of the source lines 130 and the gate lines 140 is Al, the width of the source lines 130 and the gate lines 140 is about 10 micrometers.

Figure 6:
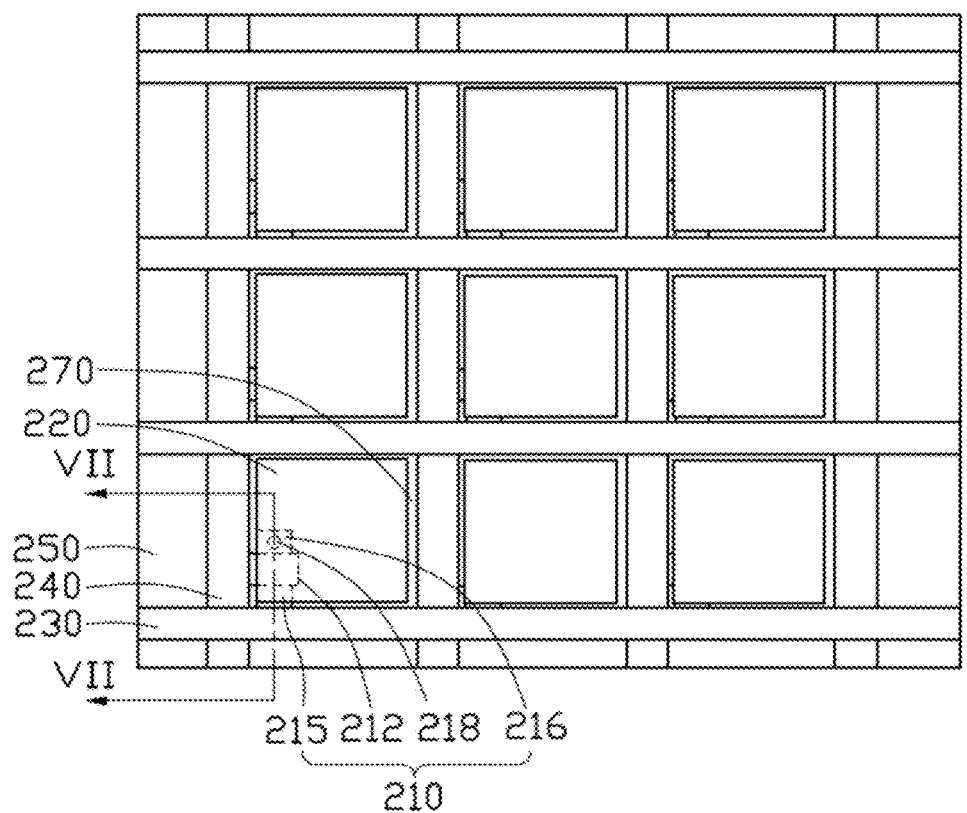
FIG. 6 is a schematic top view of another embodiment of a thin film transistor panel.
Figure 7:
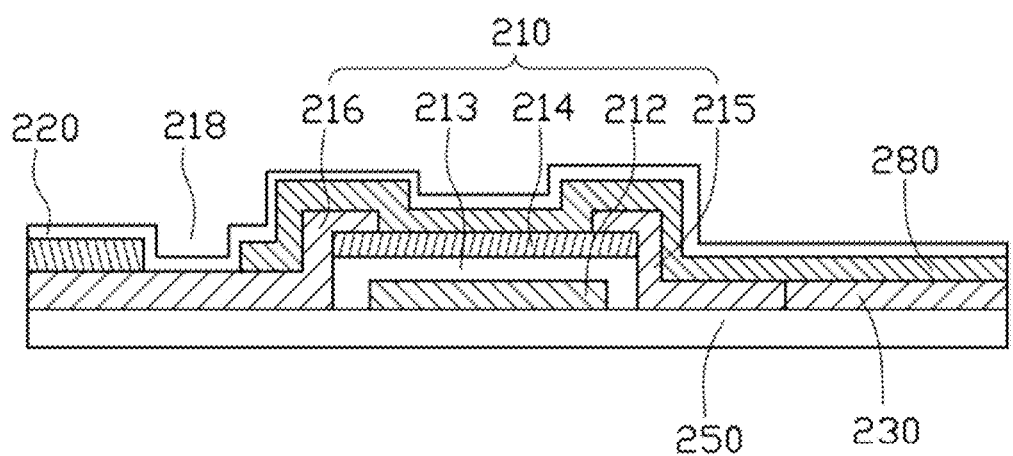
FIG. 7 is a schematic side view of another embodiment of a thin film transistor panel.

Referring to FIG. 6 and FIG. 7, another embodiment of the thin film transistor panel 200 includes a plurality of thin film transistors 210, a plurality of pixel electrodes 220, a plurality of source lines 230, a plurality of gate lines 240, and an insulating substrate 250. The structure of the thin film transistor panel 200 in the present embodiment is similar to that of the thin film transistor panel 100 in the above described embodiment. The difference is that, in the present embodiment, the thin film transistor 210 has a bottom gate structure. The pixel electrode 220 is electrically connected with the drain electrode 216 of the thin film transistor 210. More specifically, a passivation layer 260 can be further disposed on the thin film transistor 210. The passivation layer 260 covers the thin film transistor 210 and includes a through hole 218 to expose the drain electrode 216 of the thin film transistor 210. The pixel electrode 220 covers the entire grid region 270 and the thin film transistor 210 therein, and electrically connects to the drain electrode 216 at the through hole 218. The material of the passivation layer 260 can be a rigid material such as Si$_3$N$_4$ or SiO$_2$, or a flexible material such as PET, BCB, or acrylic resins.

Figure 8:
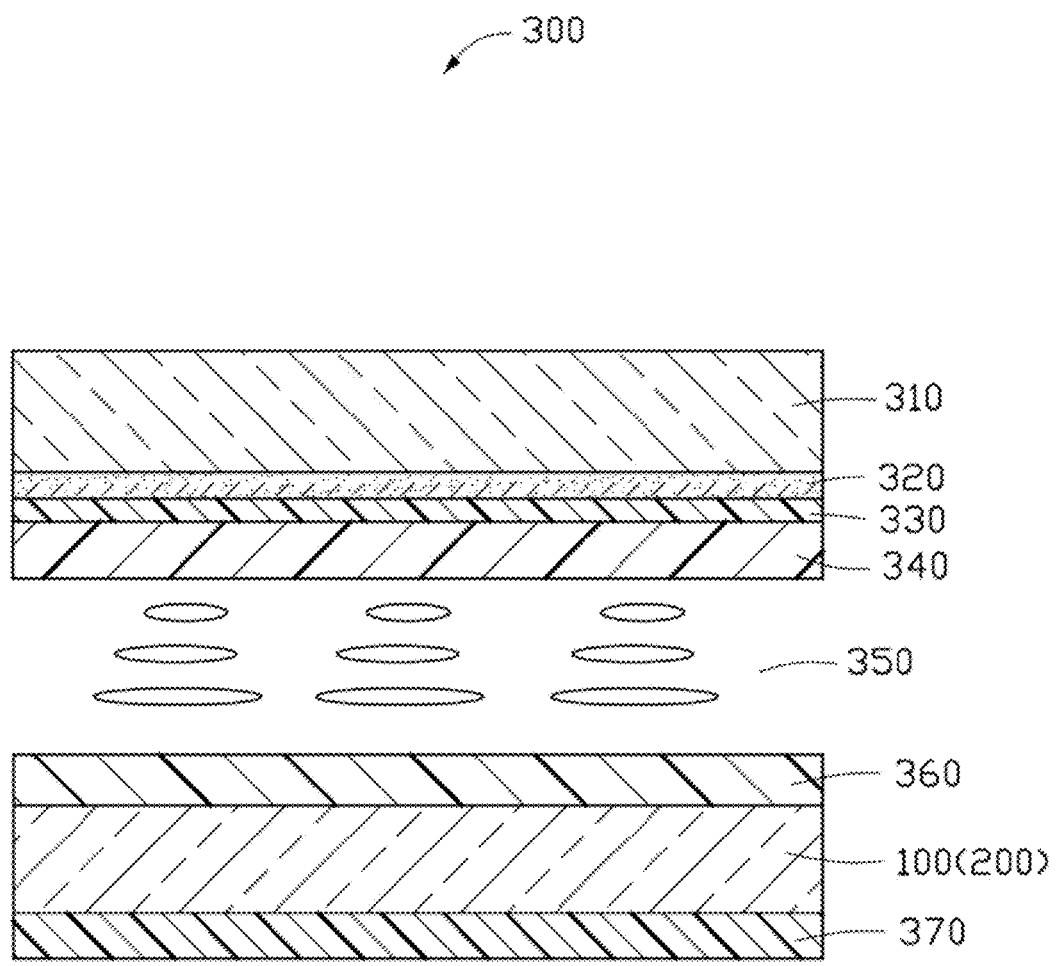
FIG. 8 is a schematic view of one embodiment of a display device.

Referring to FIG. 8, one embodiment of a display device 300 comprises the above described thin film transistor panel 100 or 200. More specifically, the display device 300 comprises a top board 310, a first polarizer 320, a common electrode layer 330, a first alignment layer 340, a liquid crystal layer 350, a second alignment layer 360, a thin film transistor panel 100 or 200, and a second polarizer 370.

The top board 310 is disposed at a top side of the display device 300. The first polarizer 320 is disposed on a lower surface of the top board 310 and controls the emitting of the polarized light. The common electrode layer 330 is disposed on a lower surface of the first polarizing layer 320. The first alignment layer 340 is disposed on a lower surface of the common electrode layer 330 and adjacent to the liquid crystal layer 350. A plurality of first grooves parallel to each other are located on a lower surface of the first alignment layer 340. The plurality of first grooves is used to make the liquid crystal molecules align along a same direction. The liquid crystal layer 350 includes a plurality of line shaped liquid crystal molecules. The second alignment layer 360 is disposed on an upper surface of the thin film transistor panel 100 or 200 and adjacent to the liquid crystal layer 350. A plurality of second grooves parallel to each other and perpendicular to the first grooves can be located on a surface of the second alignment layer 360 facing the liquid crystal layer 350. An alignment direction of the first grooves is perpendicular to an alignment direction of the second grooves. The second grooves of the second alignment layer 360 are used to make the liquid crystal molecules align along a same direction. Since the alignment direction of the first grooves is perpendicular to the alignment direction of the second grooves, the alignment direction of the liquid crystal molecules differ by 90 degrees between the first alignment layer 340 and the second alignment layer 360 to play a role of shifting the light beams polarized by the second polarizer 370 90 degrees. A polarizing direction of the second polarizer 370 is perpendicular to the polarizing direction of the first polarizer 320. The display device 300 can further comprise a back light unit located at a lower side of the second polarizer 370.

Example 1

Sputtering Target

Example 1-1

209 g of $In_2O_3$ powder, 260 g of $CeO_2$ powder and 61 g of ZnO powder with a molar ratio as $In_2O_3:CeO_2:ZnO$ is 1:2:1 and purities of 4N are mixed in a ball milling machine having water as the liquid medium, at a rotating speed of about 200 rpm for about 10 hours. After that, the mixed substance is dried at a pressure of about 1 atm in an Ar gas atmosphere (5N) for about 1 hour to remove the water. The mixture is hot pressed in Ar gas atmosphere at a pressure of about 50 MPa and a temperature of about 1350° C. for about 5 hours with a speed of temperature increase of about 15° C./min. The obtained sputtering target has a relative density >87% and a bulk resistance of 0.75 Ωcm.

Example 1-2

249 g of $In_2O_3$ powder, 231 g of $CeO_2$ powder and 73 g of ZnO powder with a molar ratio as $In_2O_3:CeO_2:ZnO$ is 2:3:2 and purities of 4N are mixed in a ball milling machine having ethanol as the liquid medium at a rotating speed of about 400 rpm for about 20 hours. After that, the mixed substance is dried at a pressure of about 1 atm in an Ar gas atmosphere (5N) for about 1 hour to remove the ethanol. The mixture is placed in a mold and cold pressed at a pressure of about 75 MPa for about 60 minutes. The molded mixture is sintered at a normal pressure in $N_2$ gas atmosphere (5N) at a temperature of about 1450° C. for about 8 hours with a speed of temperature increase of about 10° C./min. The obtained sputtering target has a relative density >85% and a bulk resistance of 0.12 Ωcm.

Example 1-3

209 g of $In_2O_3$ powder, 260 g of $CeO_2$ powder and 61 g of ZnO powder with a molar ratio as $In_2O_3:CeO_2:ZnO$ is 1:2:1 and purities of 4N are mixed in a ball milling machine having water as the liquid medium at a rotating speed of about 500 rpm for about 10 hours. After that, the mixed substance is dried at a pressure of about 1 atm in an Ar gas atmosphere (5N) for about 1 hour to remove the water. The mixture is hot isostatically pressed in Ar gas atmosphere (5N) at a pressure of about 100 MPa and a temperature of about 1450° C. for about 20 hours with a speed of temperature increase of about 10° C./min. The obtained sputtering target has a relative density >86% and a bulk resistance of 0.62 Ωcm.

Example 2

Oxide Semiconductor Film

Example 2-1-1

A glass substrate is cleaned and dried by $N_2$ gas blowing. The glass substrate and the sputtering target of Example 1-1 are disposed in a sputtering chamber. The surfaces of the sputtering target and the substrate are parallel to each other about 8 cm distant. The carrier gas, which is Ar gas in this example, is introduced into the sputtering chamber. The Ar gas has a flow rate of about 40 sccm. The pressure in the sputtering chamber is about 0.7 Pa. The sputtering is at room temperature by using a current of about 1.0 A for about 28 minutes to form the oxide semiconductor film with a thickness of about 250 nm.

Example 2-1-2

This example is the same as Example 2-1-1 except that the carrier gas is a combination of Ar gas and $O_2$ gas. The $O_2$ gas has a flow rate of about 0.25 sccm.

Example 2-1-3

This example is the same as Example 2-1-2 except that the $O_2$ gas has a flow rate of about 0.5 sccm.

Example 2-1-4

This example is the same as Example 2-1-2 except that the $O_2$ gas has a flow rate of about 0.75 sccm.

Example 2-1-5

This example is the same as Example 2-1-2 except that the $O_2$ gas has a flow rate of about 1.0 sccm.

Example 2-1-6

This example is the same as Example 2-1-2 except that the $O_2$ gas has a flow rate of about 1.5 sccm.

Example 2-1-7

This example is the same as Example 2-1-2 except that the $O_2$ gas has a flow rate of about 2.0 sccm.

Figure 9:
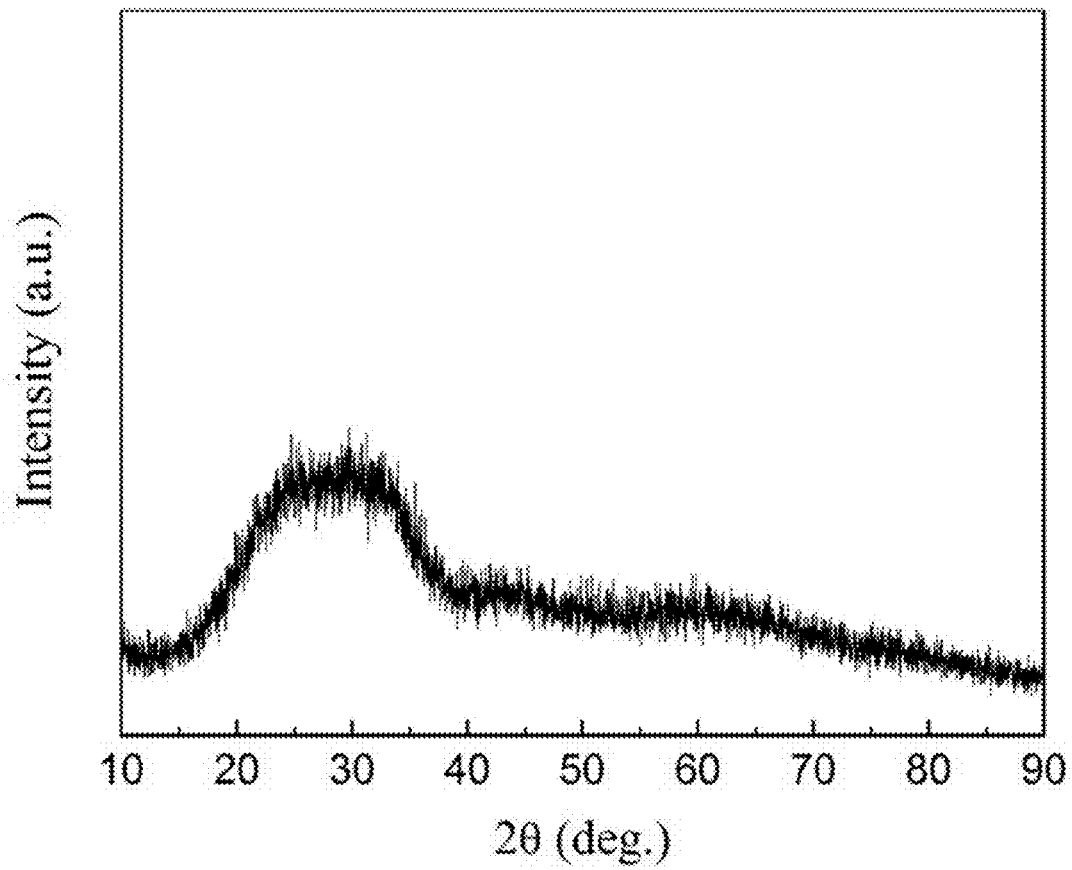
FIG. 9 shows an X-ray diffraction (XRD) pattern of the oxide semiconductor film in Example 2-1 post.
Figure 10:
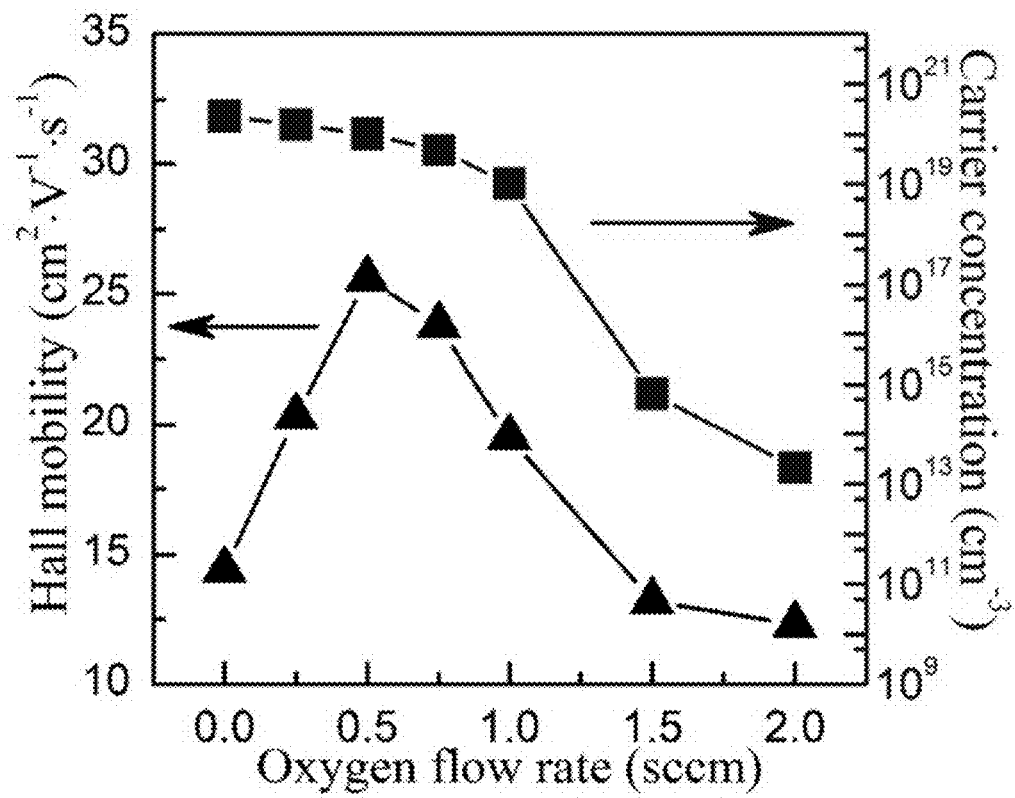
FIG. 10 is a diagram showing that electrical properties depend on different oxygen gas flow rates of the oxide semiconductor film in Example 2-1.
Figure 11:
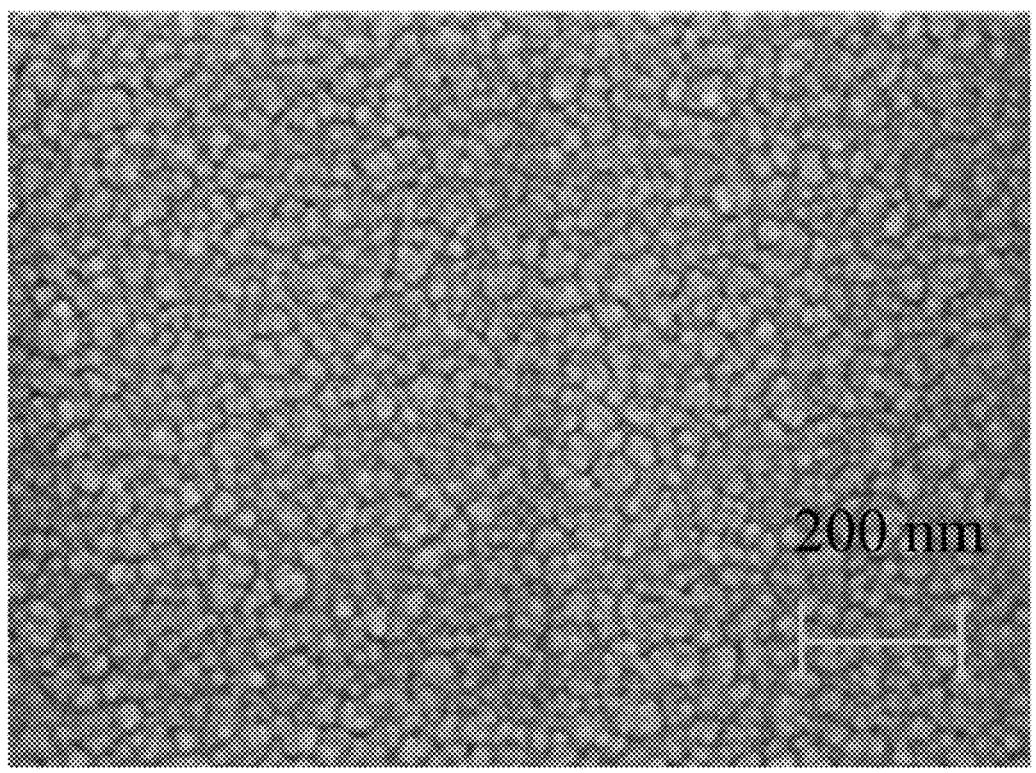
FIG. 11 shows a Scanning Electron Microscope (SEM) image of the oxide semiconductor film in Example 2-1.

The XRD tests are conducted on the oxide semiconductor films of Examples 2-1, and shows that the oxide semiconductor films are amorphous films. One of the XRD patterns is shown in FIG. 9. Hall tests are conducted on the oxide semiconductor films of Examples 2-1, and reveal that the Hall mobilities of the oxide semiconductor films are about 14 $cm^2V^{-1}$ $s^{-1}$ to about 25.6 $cm^2V^{-1}$ $s^{-1}$, and the carrier densities of the oxide semiconductor films are about $10^{13}$ $cm^{-3}$ to about $10^{20}$ $cm^{-3}$. Referring to FIG. 10, the Hall mobilities and carrier densities of the oxide semiconductor films of Examples 2-1 change with the $O_2$ gas flow rates. Referring to FIG. 11, the surface morphology of one oxide semiconductor film in Examples 2-1 is shown.

Example 2-2-1

A glass substrate is cleaned and dried by $N_2$ gas blowing. The glass substrate and the sputtering target of Example 1-2 are disposed in a sputtering chamber. The surfaces of the sputtering target and the substrate are parallel to each other at about 8 cm distant. The substrate is preheated to about 250° C. The carrier gas, which is Ar gas in this example, is introduced into the sputtering chamber. The Ar gas has a flow rate of about 40 sccm. The pressure in the sputtering chamber is about 0.7 Pa. The sputtering is at 250° C. by using a current of about 1.0 A for about 28 minutes to form the oxide semiconductor film with a thickness of about 250 nm.

Example 2-2-2

This example is the same as Example 2-2-1 except that the carrier gas is a combination of Ar gas and $O_2$ gas. The $O_2$ gas has a flow rate of about 0.5 sccm.

Example 2-2-3

This example is the same as Example 2-2-2 except that the $O_2$ gas has a flow rate of about 1.0 sccm.

Example 2-2-4

This example is the same as Example 2-2-2 except that the $O_2$ gas has a flow rate of about 1.5 sccm.

Example 2-2-5

This example is the same as Example 2-2-2 except that the $O_2$ gas has a flow rate of about 2.0 sccm.

Example 2-2-6

This example is the same as Example 2-2-2 except that the $O_2$ gas has a flow rate of about 2.5 sccm.

Example 2-2-7

This example is the same as Example 2-2-2 except that the $O_2$ gas has a flow rate of about 3.0 sccm.

Figure 12:
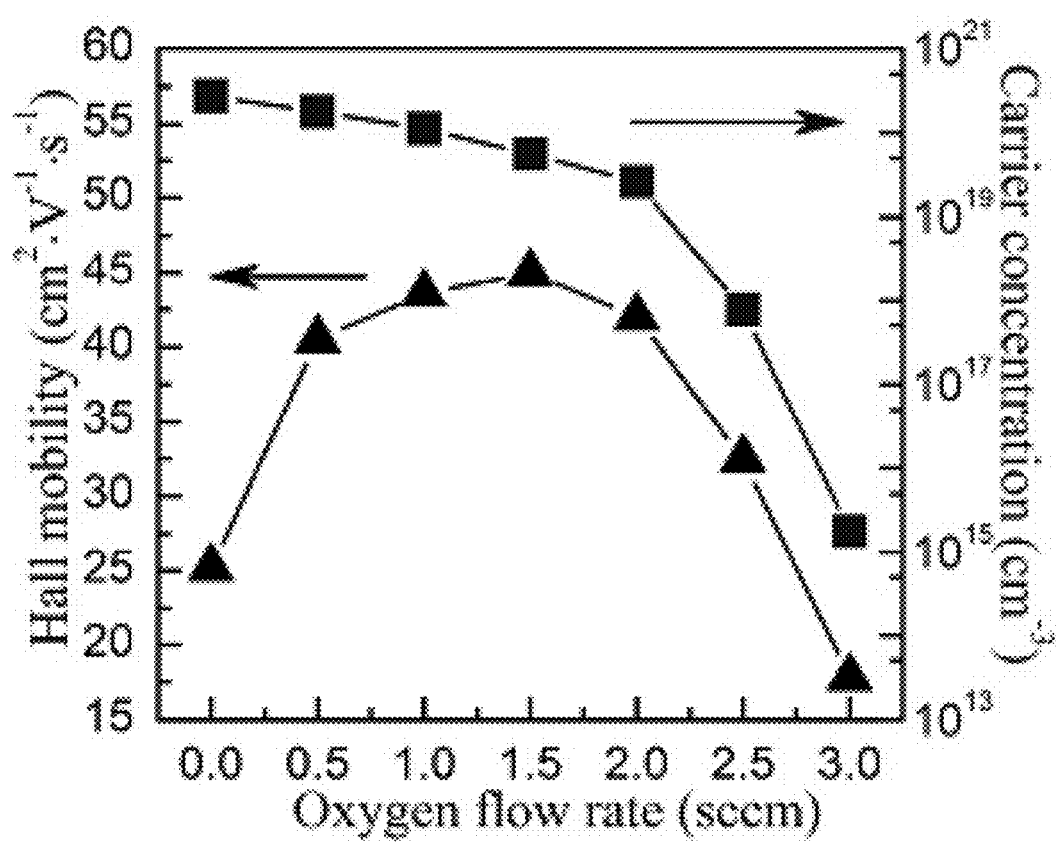
FIG. 12 is a diagram showing that different electrical properties depend on different oxygen gas flow rates of the oxide semiconductor film in Example 2-2.
Figure 13:
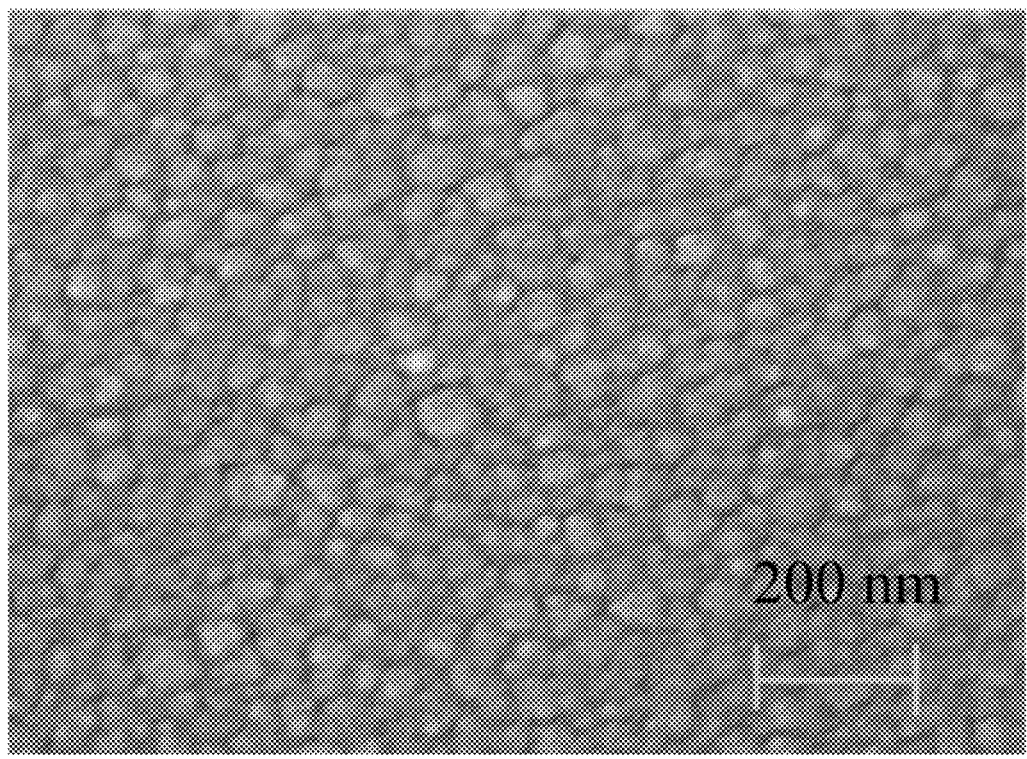
FIG. 13 shows an SEM image of the oxide semiconductor film in Example 2-2.

Hall tests are conducted on the oxide semiconductor films of Examples 2-2, and reveals that the Hall mobilities of the oxide semiconductor films are about 17.8 $cm^2V^{-1}$ $s^{-1}$ to about 45.0 $cm^2V^{-1}$ $s^{-1}$, and the carrier densities of the oxide semiconductor films are about $10^{15}$ $cm^{-3}$ to about $10^{20}$ $cm^{-3}$. Referring to FIG. 12, the Hall mobilities and carrier densities of the oxide semiconductor films of Examples 2-2 change with the $O_2$ gas flow rates. Referring to FIG. 13, the surface morphology of one oxide semiconductor film in Examples 2-2 is shown.

Example 2-3-1

A glass substrate is cleaned and dried by $N_2$ gas blowing. The glass substrate and the sputtering target of Example 1-3 are disposed in a sputtering chamber. The surfaces of the sputtering target and the substrate are parallel to each other at about 8 cm distant. The carrier gas, which is Ar gas in this example, is introduced into the sputtering chamber. The Ar gas has a flow rate of about 40 sccm. The pressure in the sputtering chamber is about 0.7 Pa. The sputtering is at room temperature by using a current of about 1.0 A for about 28 minutes to form the oxide semiconductor film with a thickness of about 250 nm. The oxide semiconductor film is then annealed an atmospheric pressure of 1 Pa for about 1 hour. The annealing temperature is about 150° C.

Example 2-3-2

This example is the same as Example 2-3-1 except that the annealing temperature is about 200° C.

Example 2-3-3

This example is the same as Example 2-3-1 except that the annealing temperature is about 250° C.

Example 2-3-4

This example is the same as Example 2-3-1 except that the annealing temperature is about 300° C.

Example 2-3-5

This example is the same as Example 2-3-1 except that the annealing temperature is about 350° C.

Figure 14:
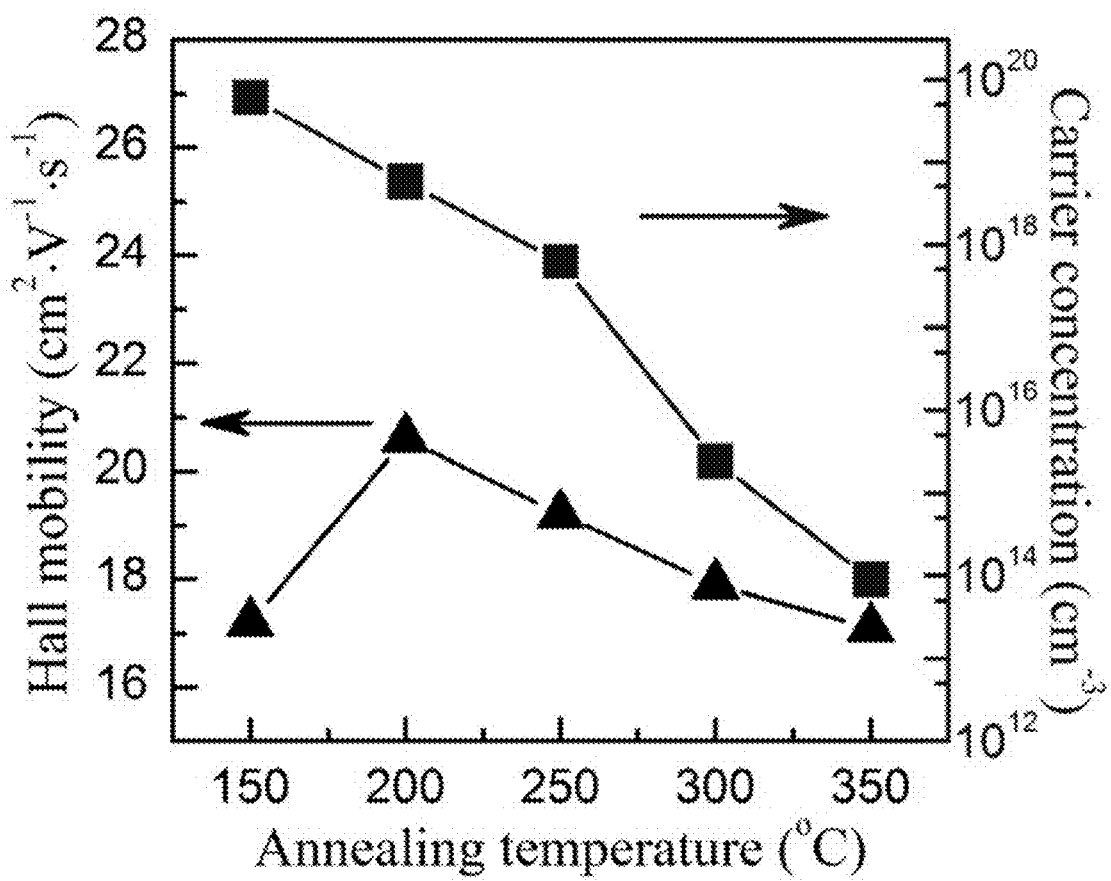
FIG. 14 is a diagram showing the effects of different annealing temperatures on the electrical properties of the oxide semiconductor film in Example 2-3.
Figure 15:
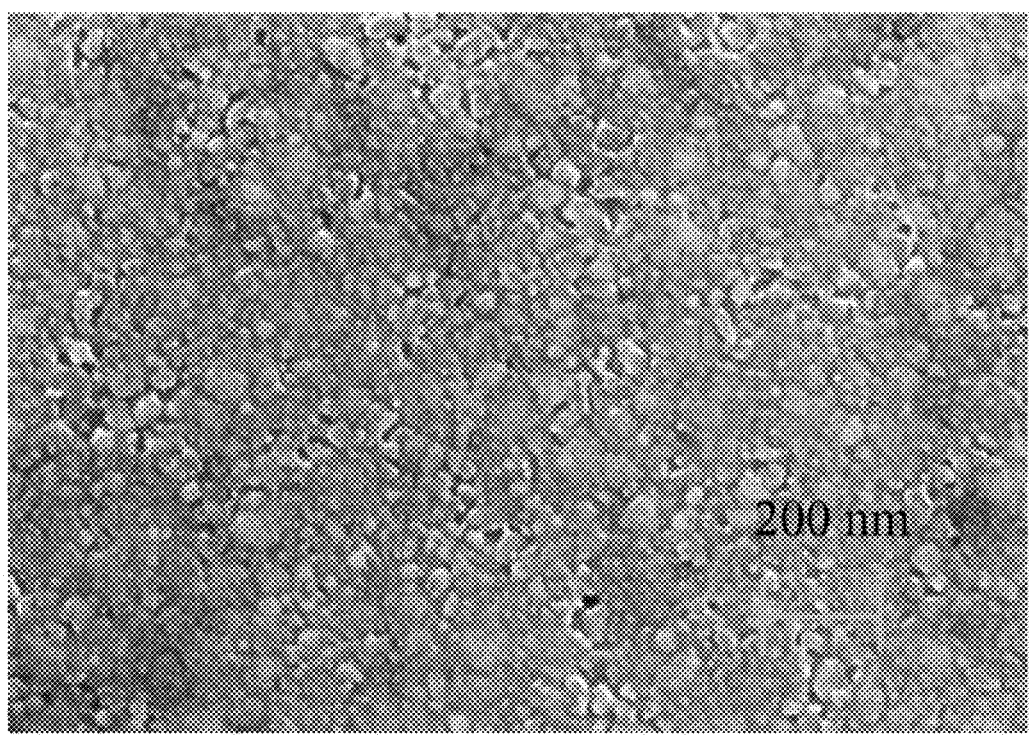
FIG. 15 shows an SEM image of the oxide semiconductor film in Example 2-3.

Hall tests are conducted on the oxide semiconductor films of Examples 2-3 before and after the annealing step. Before being annealed, the Hall mobilities of the oxide semiconductor films reach about 15.6 $cm^2V^{-1}$ $s^{-1}$, and the carrier densities of the oxide semiconductor films reach about $10^{20}$ $cm^{-3}$. After being annealed, the Hall mobilities of the oxide semiconductor films are about 17.1 $cm^2V^{-1}$ $s^{-1}$ to about 20.6 $cm^2V^{-1}$ $s^{-1}$, and the carrier densities of the oxide semiconductor films are about $10^{14}$ $cm^{-3}$ to about $10^{20}$ $cm^{-3}$. Referring to FIG. 14, the Hall mobilities and carrier densities of the oxide semiconductor films of Examples 2-3 change with the annealing temperatures. Referring to FIG. 15, the surface morphology of one oxide semiconductor film in Examples 2-3 is shown.

Depending on the embodiment, certain of the steps of methods described may be removed, others may be added, and the sequence of steps may be altered. It is also to be understood that the description and the claims drawn to a method may comprise some indication in reference to certain steps. However, the indication used is only to be viewed for identification purposes and not as a suggestion as to an order for the steps.

The embodiments shown and described above are only examples. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A method for making a thin film transistor comprising: forming a semiconducting layer, a source electrode, a drain electrode, a gate electrode, and an insulating layer; and the semiconducting layer, the source electrode, the drain electrode, the gate electrode, and the insulating layer are located on an insulating substrate; wherein a process of forming the semiconducting layer comprises a step of sputtering an oxide semiconductor film on a substrate by using a sputtering target comprising $In_2Ce_xZnO_{4+2x}$, wherein x=0.5~2.

2. The method of claim 1, wherein the sputtering target is formed by sintering a mixture of indium oxide, cerium oxide, and zinc oxide.

3. The method of claim 1, wherein the sputtering is processed at room temperature.

4. The method of claim 1 further comprising a step of heating the insulating substrate to a temperature of about 50° C. to about 400° C. in vacuum before the step of sputtering.

5. The method of claim 1, wherein a carrier gas used in the sputtering comprises a noble gas.

6. The method of claim 5, wherein the carrier gas further comprises an $O_2$ gas or a $H_2$ gas.

7. The method of claim 1, wherein the oxide semiconductor film is formed in a sputtering chamber, and a gas pressure in the sputtering chamber is in a range from about 0.1 Pa to about 2.0 Pa.

8. The method of claim 1, wherein a material of the substrate is glass, silicon, or polymer.

9. The method of claim 1 further comprising a step of annealing the semiconductor oxide film at an annealing temperature in a range from about 100° C. to about 400° C. for about 1 hour to about 10 hours.

10. The method of claim 9, wherein the substrate is heated to the annealing temperature at a speed in a range from about 1° C./min to about 20° C./min.

11. The method of claim 1, wherein a distance between a sputtering target surface and a substrate surface can is smaller than or equal to 8 cm.

12. The method of claim 11, wherein an angle is formed between the sputtering target surface and the substrate surface, and the angle is in a range from about 20° to about 85°.

13. The method of claim 1, wherein the oxide semiconductor film is an n-type semiconductor.

14. The method of claim 1, wherein the oxide semiconductor film is in a range from about 50 nm to about 1000 nm thick.

* * * * *